(12) United States Patent
Bula et al.

(10) Patent No.: US 6,425,112 B1
(45) Date of Patent: Jul. 23, 2002

(54) AUTO CORRECTION OF ERROR CHECKED SIMULATED PRINTED IMAGES

(75) Inventors: Orest Bula, Shelburne; Daniel C. Cole, Jericho; Edward W. Conrad, Jeffersonville; William C. Leipold, Enosburg Falls, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/335,305

(22) Filed: Jun. 17, 1999

(51) Int. Cl.[7] .............................................. E06F 17/50
(52) U.S. Cl. ........................................................ 716/5
(58) Field of Search .............................. 430/30; 716/5, 716/21

(56) References Cited

U.S. PATENT DOCUMENTS

| | | | |
|---|---|---|---|
| 4,902,899 A | 2/1990 | Lin et al. ........................ | 430/5 |
| 5,362,585 A | * 11/1994 | Adams ........................ | 430/30 |
| 5,432,714 A | 7/1995 | Chung et al. ................. | 716/19 |
| 5,631,110 A | 5/1997 | Shioiri et al. .................. | 430/5 |
| 5,698,346 A | 12/1997 | Sugawara ..................... | 430/5 |
| 5,705,301 A | 1/1998 | Garza et al. .................... | 430/5 |
| 5,707,765 A | 1/1998 | Chen .............................. | 430/5 |
| 5,723,233 A | 3/1998 | Garza et al. ................... | 430/5 |
| 5,725,974 A | 3/1998 | Kawahira ...................... | 430/5 |
| 5,740,068 A | 4/1998 | Liebmann et al. ............ | 716/21 |
| 5,795,688 A | 8/1998 | Burdorf et al. ............... | 514/16 |
| 6,015,644 A | * 1/2000 | Cirelli .......................... | 430/30 |

OTHER PUBLICATIONS

Makers of CATS(tm) Software Computer Aided Transcription System, "Mask and Wafer Image Enhancement Through Advanced Fracture Techniques", BACUS '97, Sep. 1997, pp. 1–12.

* cited by examiner

Primary Examiner—Matthew Smith
Assistant Examiner—Thuan Do
(74) Attorney, Agent, or Firm—McGinn & Gibb, PLLC; Richard M. Kotulak Esq.

(57) ABSTRACT

A method and computer system are provided for checking integrated circuit designs for design rule violations. The method may include generating a working design data set, creating a wafer image data set, comparing the wafer image data set to the design rules to produce an error list and automatically altering the working design data set when the comparing indicates a design rule violation. The method further automatically repeats the creating, the comparing and the automatically altering until no design rule violations occur or no solution to the errors exists.

24 Claims, 4 Drawing Sheets

AUTO CORRECTION OF ERROR CHECKED SIMULATED PRINTED IMAGES

BACKGROUND OF THE INVENTION

1. Field of the Invention

The present invention generally relates to modeling of integrated circuit layouts and more particularly to an improved process for checking for and correcting design rule violations.

2. Description of the Related Art

Conventional integrated circuit design rule checking systems check designed shapes against a complicated set of rules. More recently, design rule checking systems have begun to utilize commercial programs (such as those by Numerical Technologies, Inc., 333 West Maude Ave., Suite 207, Sunnyvale, Calif., U.S.A.), which model many of the diffraction induced phenomena and subsequently use the modeled wafer image as the input to a design rule checker. This approach simplifies the coding of the design rule checker since the complexities of the diffraction phenomena are accounted for in the wafer image modeling program. However, such conventional approaches do not account for photolithographic or other process effects on the net process window.

As the minimum feature size in semiconductor integrated circuit technology is pushed below the wavelength of the light used to transfer the mask images to the wafers, diffraction effects introduce the need for additional complex design rules. In addition, other physical effects such as localized etch variations, mask distortions, lens distortions, and topography related effects introduce deviations between the desired and actual printed patterns on the wafer. These effects become increasingly important as the physical dimensions of the circuit elements decrease. These complexities make it difficult both to do the design layout and the design rule checking (DRC) correctly.

FIG. 1A is a flowchart of a prior art design checking program and FIG. 1B illustrates shapes correlating to the flowchart in FIG. 1A.

Input from the design manual 10 is used to create a design data set 11 which forms the first set of shapes 16. Next, optical proximity correction and/or phase shift mask adjustment programs add notches and bars 18 or other changes to the initial set of shapes 16 to reduce the anticipated distortion which occurs during the manufacturing process to produce the shapes shown as items 17 in FIG. 1B.

A simulation program produces the wafer image 19 as shown in block 13. The simulated manufactured image 19 usually has rounded comers, and other distortions. Next a design rule check 14 is performed to determine, for example, if the space A (e.g., the space between the images 19) is within the range specified in the design rules. If the space A violates a design rule it would be flagged and identified on an errorlist 15.

The conventional approaches do not explore the effects of process variations such as focus, exposure, overlay, etc., in determining whether the shapes obey the design rules. Conventional systems utilize very complicated rule sets, have an approach limited to nominal processing quality, and do not account for real world manufacturing complications.

Further, the process window variation ultimately is a key factor in determining the manufacturability of the design. The present state of the art entails running the checker, finding errors, and then manually modifying the design in an attempt to fix the errors. Because some of the process effects are non-linear and non-local, the changes required to fix the error can be far from obvious. Presently, fixes may be typically made by either simply adjusting entire edges of existing shapes or moving entire shapes. These fixes do not take into account any of the important but subtle non-linear and non-local effects mentioned above.

SUMMARY OF THE INVENTION

It is, therefore, an object of the present invention to provide a method and computer system for checking designs for design rule violations. The method may include generating a working design data set based on the designs, creating an image data set based on the working design data set, comparing the image data set to the design rules and automatically altering the working design data set when the comparing indicates a design rule violation. The method may further automatically repeat the creating, the comparing and the automatically altering until no design rule violations occur or until no solution to the errors exists.

The method may also include adjusting at least one of size, shape and spacings of the working design data set. Further, the wafer image data set may be a predicted printed structure on a wafer and the method may check integrated circuit designs. The design rules may check spacing, intersection area, common run lengths and overlapping. Further, the altering may add notches to the working design data set.

This method has the advantage that design rule errors occurring anywhere within the process window will automatically be fixed if possible or flagged as unfixable within the constraints of the existing layout. Even errors caused by complex non-local optical phenomena can be corrected by this method.

Other objects, advantages and salient features of the invention will become apparent from the following detailed description taken in conjunction with the annexed drawings, which disclose preferred embodiments of the invention.

BRIEF DESCRIPTION OF THE DRAWINGS

The invention will be described in detail with reference to the following drawings in which like reference numerals refer to like elements and wherein.

DETAILED DESCRIPTION OF PREFERRED EMBODIMENTS OF THE INVENTION

Figure 1A:
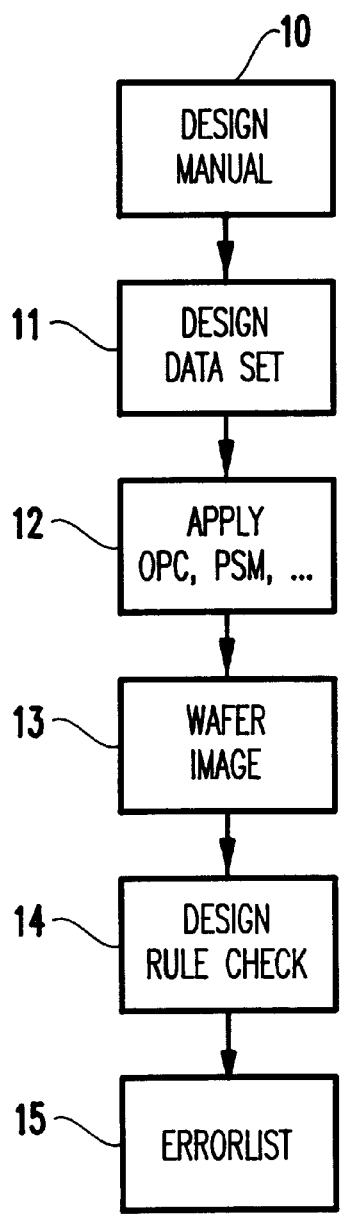
FIG. 1A is a flowchart of a design rule checking program.
Figure 1B:
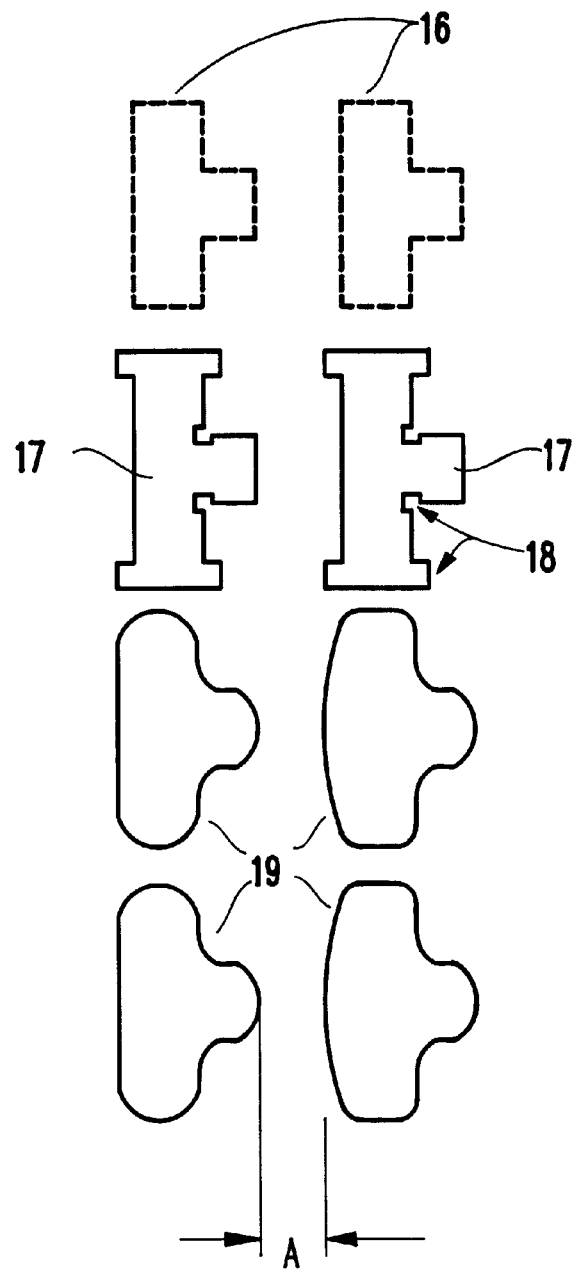
FIG. 1B illustrates schematic images produced by the design rule checking program in FIG. 1A.
Figure 2A:
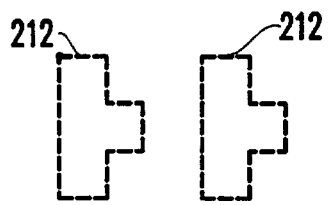
FIGS. 2A–2E illustrate schematic images produced by a design rule checking and error correcting program according to the present invention.
Figure 2B:
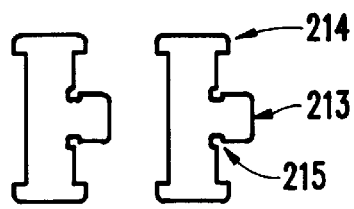
Figure 2C:
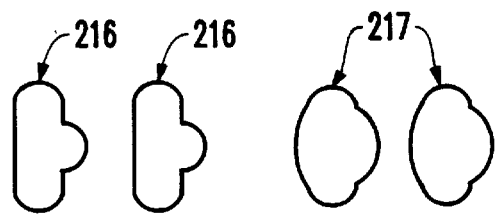
Figure 2D:
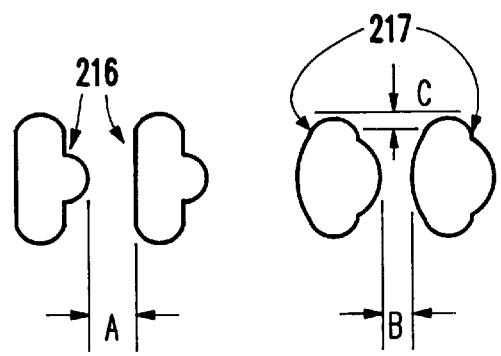
Figure 2E:
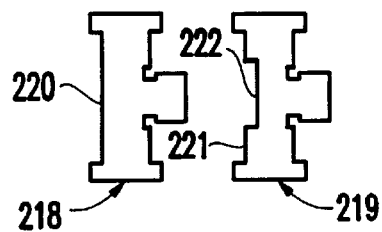
Figure 3:
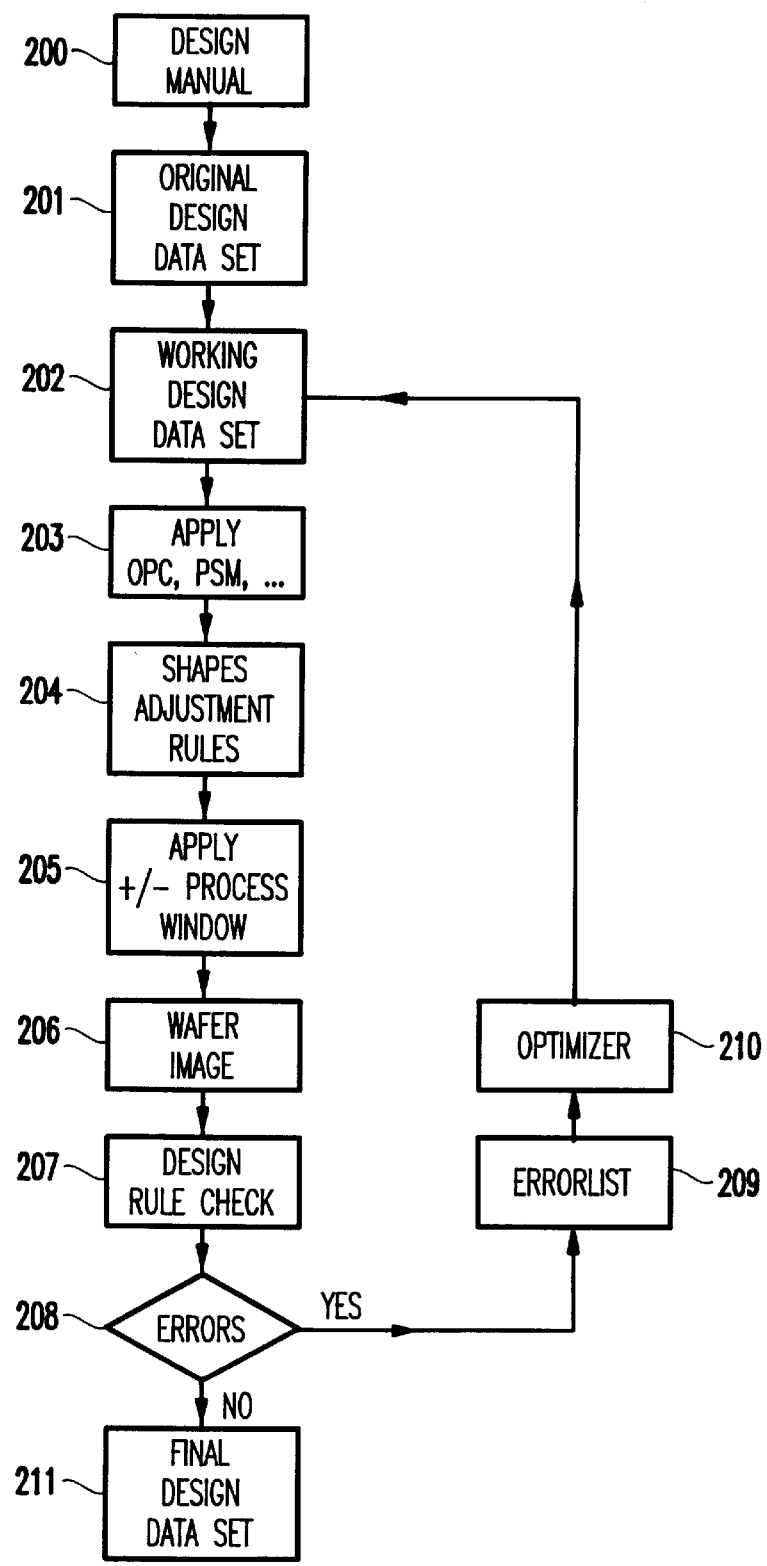
FIG. 3 is a flowchart of a design rule checking and error correcting system illustrating a preferred method of the invention.

Referring now to the drawings, and more particularly to FIGS. 2A–2E and 3, a flowchart and the shapes produced by the processing in the flowchart are illustrated. As shown in FIGS. 2A and 3, input from a design manual 200 is used to create a design data set 201 of shapes 212. To initialize the program, this original data set 201 is designated a working design data set 202. Next, optical proximity corrections (OPC), aberration correction, and/or phase shift mask (PSM)

adjustments, etc. are applied to the size, shape and spacing of the shapes 212 in step 203 to counteract the anticipated distortion that occurs during manufacturing, as shown in block 203. As discussed in the background section above, internal corners are notched 215 and external corners 214 may be extended with bars 213 to reduce anticipated distortions.

The working design data set 202 is subjected to shapes adjustment rules 204 which are intended to make changes to compensate for distortions introduced by the mask manufacturing process. The resultant shapes from steps 203 and 204 may have some of the adjustments illustrated in FIG. 2B such as bars at the ends of some shapes, notches in internal corners and beveled corners. The shapes adjustment rules 204 may consist of something as simple as beveling the corners of shapes or as complex as the output of an e-beam modeling tool.

Process window variations 205 such as exposure dose, focus, etch time, etc. which simulate real-world manufacturing processes are used to generate physical models 206 representing the different shapes 216, 217 as they would actually be printed by the adjusted working data set. The range of different shapes that would be produced is dependent upon the different conditions within the process window.

Thus, wafer images 216 and 217 are the predicted printed structures on the wafer at two different points in the process window. The model may incorporate optical diffraction effects and resist and etch processing effects via an empirical model. Present models are yielding good predictions for how structures will be printed in a real manufacturing process, resulting in printed features with rounded corners and shortened and elongated lengths as compared with the design data. FIG. 2C shows these predicted printed structures which are also hereinafter referred to as wafer images 216 and 217. Depending on how the design rule check is performed, checks may be made directly on the dimensions of the predicted printed shapes or wafer image 216, or they may be made on process window variations of these predicted structures. The process window is the range of variations in process parameters such as exposure dose, focus, or etch time which result in acceptable wafer images 216, 217.

The generated dimensions are then compared to design rules in step 207. If an error occurs in step 208, then an error list is generated in step 209, which is then fed into the optimizer 210, along with the most current working design data set 202. If no error occurs in step 208, then the working design data set 202 is determined to be the final design data set 211.

The optimizer 210 includes rules that may change shapes and spatial arrangements of the current working data set 202. For example, when the space "A" or "B" from FIG. 2D is determined to be too small using a space and run length notch rule, the optimizer 210 may place a notch in one of the images to correct this spacing error and output new or revised data sets. A space and run length rule typically states that two shapes may have a minimum separation (space) for a limited distance (run length) and must have a greater than minimum separation if the length over which the separation occurs exceeds the run length limit. FIG. 2E shows several exemplary notches 220–222 which have been added by the optimizer 210 to correct errors.

In conventional systems, the changing of shapes and spatial arrangements would be done either manually or the images would get shifted to fix this spacing error after the automated DRC system had been completed. However, this could create a ripple of additional errors, which may result in a defective product or in the design being scrapped. To the contrary, the present invention modifies the working design data set at this point and repeats the DRC analysis on the modified working design data set.

After adding to or revising the working design data set, the revised (or modified) working design data set then becomes the new working design data set 202 and the steps 203–208 are subsequently repeated using the new working design data step 202. Step 208 is then repeated to determine if any errors still exist. This iterative process continues until all of the rules are satisfied or until the system determines that it is unable to correct all the errors.

This methodology takes advantage of the physical model already present in the system for predicting the printability of the desired wafer structures. The optimizer 210 can be accomplished by a conventional brute force numerical device, or tailored optimization methods may be constructed that accelerate this process. In any case, the software tools are incorporated directly into the design rule check process that refines the mask data structure until no errors are detected in the design rule check process. Exemplary software to perform the functions of the optimizer 210 are commercially available from Sagantec located in Fremont, Calif., U.S.A. Such a process significantly speeds up the design and checking process, and directly incorporates the complex nonlinear and non-local effects that exist in current micro-lithographic semiconductor related printing processes.

Figure 4:
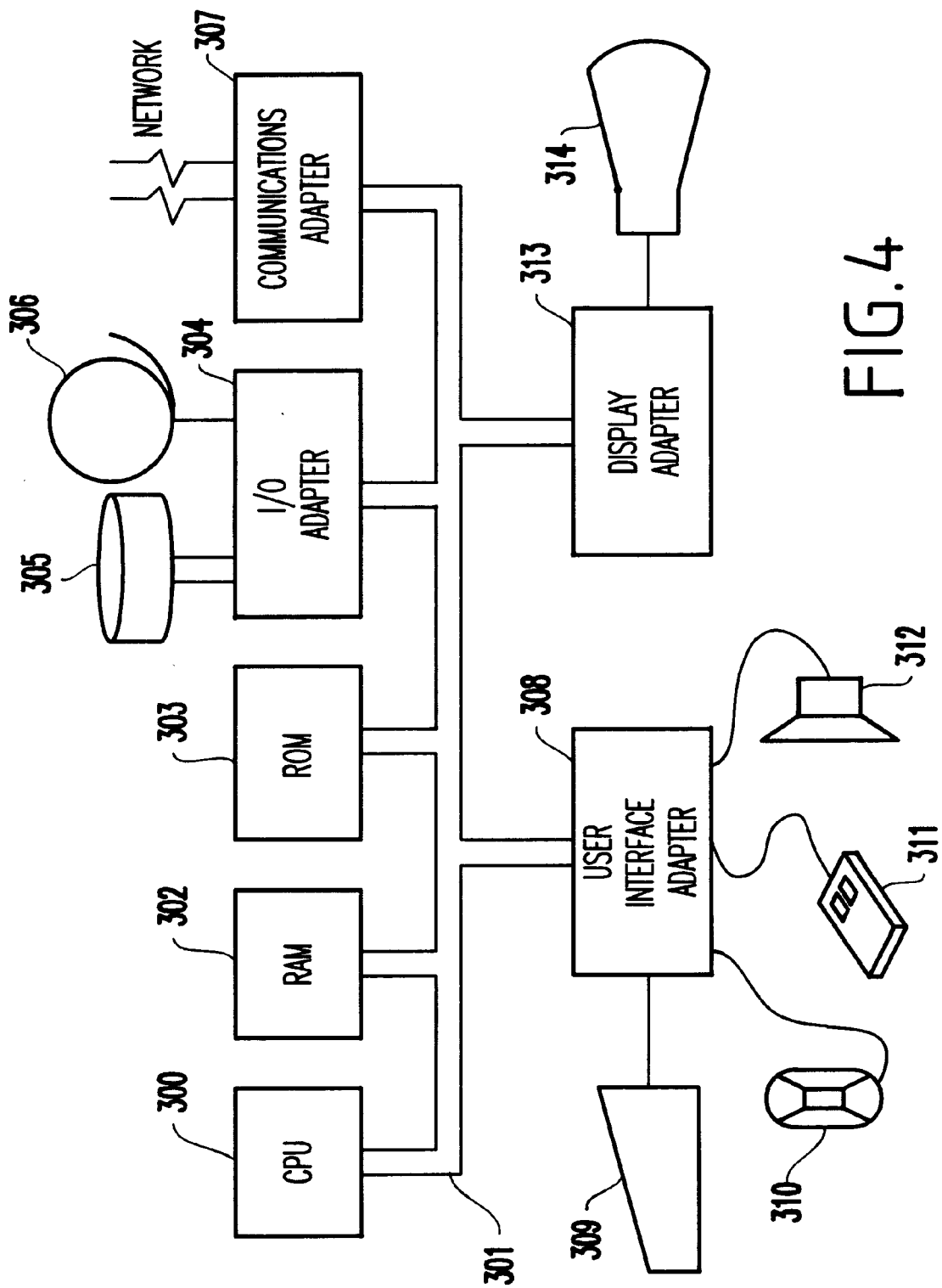
FIG. 4 is a typical hardware configuration of an information handling/computer system in accordance with the invention.

FIG. 4 illustrates a typical hardware configuration of an information handling/computer system for operating the invention. Such a system preferably has at least one processor or central processing unit (CPU) 300. The CPU 300 is interconnected via a system bus 301 to a random access memory (RAM) 302, read-only memory (ROM) 303, input/output (I/O) adapter 304 (for connecting peripheral devices such as disk units 305 and tape drives 306 to the bus 301), communication adapter 307 (for connecting an information handling system to a data processing network), user interface adapter 308 (for connecting a keyboard 309, microphone 310, mouse 311, speaker 312 and/or other user interface device to the bus 301), and display adapter 313 (for connecting the bus 301 to a display device 314).

By incorporating the physical effects of the process in the process window and wafer image generation software, the layout rules may be significantly simplified, resulting in improved design rule checking speed. A relatively simple set of correction rules enables the optimizer 210 to correct many of the errors found by the design rule checking software by means of the iterative procedure shown in FIG. 3. The complex rules associated with non-linear and non-local effects of the process, which make it difficult to know how to correct design rule checking errors, are thus hidden from the designer and implemented algorithmically in the automated system.

This approach could be applied to any process where design shapes are checked and modified to be consistent with a manufacturing process and where the manufacturing process can be modeled in software. Examples include designs for grinding or other processes where material is removed, for processes where materials are deposited, or for any shape forming process such as stamping, casting, or molding.

Therefore, as discussed above, conventional systems perform the optimization process after the design rules checking process has been completed. In other words, conventional systems only optimize the final design data set. However, because the optimization process shifts the images, the conventional systems often include errors in the final design which are difficult or impossible to resolve. To the contrary, the invention includes the optimization process as part of the design rules checking process to eliminate all errors, including those errors caused by the optimization process. Further, the invention automatically repeats the design rule checking process and optimization in an iterative process until all errors are eliminated or until no solution to the errors exists. Therefore, the invention produces final design sets which are superior to those produced by conventional systems because the final design set is automatically optimized during the design rules correction process.

While the invention has been described with reference to specific embodiments, the description of the specific embodiments is illustrative only and is not to be considered as limiting the scope of the invention. Various other modifications and changes may occur to those skilled in the art without departing from the spirit and scope of the invention.

What is claimed is:

1. A method for checking designs for design rule violations comprising:
   generating a working design data set based on said designs;
   creating an image data set based on said working design data set;
   comparing said image data set to said design rules for one or more of spacing, intersection area, common run lengths, and overlapping;
   automatically altering said working design data set when said comparing indicates a design rule violation; and
   automatically repeating said creating, said comparing and said automatically altering until one of no design rule violations occur and no solution exists.

2. The method of claim 1, wherein said altering comprises adjusting at least one of size, shape and spacings of the working design data set.

3. The method of claim 1, wherein said image data set is a predicted printed structure on a wafer.

4. The method of claim 1, wherein said altering comprises adding notches to the working design data set.

5. The method of claim 1, wherein said design rules check one or more of spacing, intersection area, common run lengths and overlapping.

6. The method of claim 1, wherein said method checks integrated circuit designs.

7. A method of checking a design data set comprising a plurality of shapes having a spatial relationship to one another against rules, the method comprising:
   applying a set of systematic error correction rules to said design data set to modify said design data set into a first intermediate design data set;
   applying a set of shapes adjustment rules to change to said first intermediate design data set into a second intermediate design set;
   applying a set of process window rules to said second intermediate design data set to change said second intermediate design data set into an image data set;
   checking said image data set for a violation of said rules;
   modifying said first intermediate design data set in response to said violation of said rules; and
   automatically repeating said method until one of determining said image data set is free from violating said rules and determining no solution exists.

8. The method of claim 7, wherein said first intermediate design data set is modified using a set of optimization rules.

9. The method of claim 7, wherein said image data set is a predicted printed structure on a wafer.

10. The method of claim 7, wherein said rules check one or more of spacing, intersection area, common run lengths and overlapping.

11. The method of claim 7, wherein said method checks integrated circuits.

12. A computer system comprising at least one central processing unit, at least one input device, at least one output device and at least one storage device, said storage device tangibly embodying a program of instructions executable by the central processing unit to perform a method for checking designs for design rule violations, said method comprising:
   generating a working design data set based on said designs;
   creating an image data set based on said working design data set;
   comparing said image data set to said design rules for one or more of spacing, intersection area, common run lengths and overlapping;
   automatically altering said working design data set when said comparing indicates a design rule violation; and
   automatically repeating said creating, said comparing and said automatically altering until one of no design rule violations occur and no solution exists.

13. The system of claim 12, wherein said method further comprises adjusting at least one of size, shape and spacings of said working design data set.

14. The system of claim 12, wherein said image data set is a predicted printed structure on a wafer.

15. The system of claim 12, wherein said altering comprises adding notches to the working design data set.

16. The system of claim 12, wherein said design rules check one or more of spacing, intersection area, common run lengths and overlapping.

17. The system of claim 12, wherein said method checks integrated circuits.

18. A method of checking a design data set comprising a plurality of shapes against design rules, the method comprising:
   creating a simulated image data set based on said design data set;
   checking said simulated image data set against said design rules for one or more of spacing, intersection area, common run lengths, and overlapping;
   modifying said design data set by applying a set of optimization rules in response to a violation of said design rules; and
   automatically repeating said checking and said modifying until one of no design rule violations occur and no solution exists.

19. The method of claim 18, wherein said modifying comprises adjusting at least one of size, shape and spacings of said design data set.

20. The method of claim 18, wherein said image data set is a predicted printed structure on a wafer.

21. The method of claim 18, wherein said modifying comprises adding notches to the design data set.

22. The method of claim 18, wherein said design rules check one or more of spacing, intersection area, common run lengths and overlapping.

23. The method of claim 18, wherein said method checks integrated circuit designs.

24. A program storage device readable by machine, tangibly embodying a program of instructions executable by the machine to perform a method for checking designs for design rule violations, said method comprising:

generating a working design data set based on said designs;

creating an image data set based on said working design data set;

comparing said image data set to said design rules for one or more of spacing, intersection area, common run lengths, and overlapping;

automatically altering said working design data set when said comparing indicates a design rule violation; and automatically repeating said creating, said comparing and said automatically altering until one of no design rule violations occur and no solution exists.

* * * * *